(12) United States Patent
Okamoto et al.

(10) Patent No.: US 9,209,795 B2
(45) Date of Patent: Dec. 8, 2015

(54) SIGNAL PROCESSING DEVICE AND MEASURING METHOD

(71) Applicant: SEMICONDUCTOR ENERGY LABORATORY CO., LTD., Atsugi-shi, Kanagawa-ken (JP)

(72) Inventors: Yuki Okamoto, Kanagawa (JP); Takayuki Ikeda, Kanagawa (JP); Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 24 days.

(21) Appl. No.: 14/275,015

(22) Filed: May 12, 2014

(65) Prior Publication Data

US 2014/0340073 A1    Nov. 20, 2014

(30) Foreign Application Priority Data

May 17, 2013    (JP) .................................. 2013-105633

(51) Int. Cl.
*G01R 31/26* (2014.01)
*H03K 17/16* (2006.01)
*G01R 19/252* (2006.01)

(52) U.S. Cl.
CPC ............ *H03K 17/162* (2013.01); *G01R 19/252* (2013.01); *G01R 31/2621* (2013.01)

(58) Field of Classification Search
None
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Sekine.Y et al., "Success in Measurement the Lowest Off-State Current of Transistor in the World,", ECS Transactions, 2011, vol. 37, No. 1, pp. 77-88.

(Continued)

*Primary Examiner* — Minh N Tang
(74) *Attorney, Agent, or Firm* — Nixon Peabody LLP; Jeffrey L. Costellia

(57) ABSTRACT

A signal processing device and a measuring method are provided. A ring oscillator includes (2n+1) signal transmission circuits (n is an integer greater than or equal to 1). One of the signal transmission circuits comprises an inverter, a first transistor, and a second transistor; one of an input terminal and an output terminal of the inverter is connected to one of a source and a drain of the first transistor; one of a source and a drain of the second transistor is connected to a gate of the first transistor; an output of a k-th (k is an integer greater than or equal to 1 and less than or equal to 2n) signal transmission circuit is connected to an input of a (k+1)-th signal transmission circuit; and an output of a (2n+1)-th signal transmission circuit is connected to an input of a first signal transmission circuit.

14 Claims, 9 Drawing Sheets

(56) References Cited

U.S. PATENT DOCUMENTS

| | | | |
|---|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0175646 A1 | 7/2011 | Takemura et al. |
| 2011/0254538 A1 | 10/2011 | Kato et al. |
| 2012/0212995 A1 | 8/2012 | Kurokawa |
| 2012/0293200 A1 | 11/2012 | Takemura |
| 2014/0176222 A1* | 6/2014 | Zhu et al. ............. 327/333 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 9/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Murakami.M et al., "Theoretical Examination on a Significantly Low Off-State Current of a Transistor Using Crystalline In—Ga—Zn—Oxide,", in Proc. AM-FPD'12 Dig., Jul. 2012, pp. 171-174.

Murakami.M et al., "Theoretical Examination on a Significantly Low Off-State Current of a Transistor Using Crystalline Crystalline In—Ga—Zn—Oxide,",Ext. Abstr. Solid States Devices and Materials, 2012, pp. 320-321.

K. Kato et al., "Evaluation of Off-State Current Characteristics of Transistor Using Oxide Semiconductor Material, Indium—Gallium—Zinc Oxide", Jpn. J. Appl. Phys., 51 (2012), pp. 021201-1-7.

H.Godo et al., "Modeling and Measurement of Ultra-low Leakage Current of IGZO TFTs and New Driving Method of LCDs" IDW '10, 2010, pp. 235-238.

Coates.D et al., "Optical Studies of The Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al , "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "SPINEL, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

(56) References Cited

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura. K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTS) for AMLCDs", Journal of the SID, 2007, vol. 15, No. 1, pp. 17-22.
Park.S et al., "Challenge to Future Displays: Transparent AM-OLED Driven by Peald Grown ZnO TFT", IMID '07 DIGEST, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of The 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-263.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B. (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

(56) References Cited

OTHER PUBLICATIONS

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys, Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

SIGNAL PROCESSING DEVICE AND MEASURING METHOD

BACKGROUND OF THE INVENTION

1. Field of the Invention

This disclosure relates to a signal processing device and a measuring method.

2. Description of the Related Art

A transistor in which an oxide semiconductor is used to achieve an extremely low off-state current is disclosed. The off-state current cannot be sufficiently accurately measured by a generally used current measuring instrument. In view of this, for example, Patent Document 1 and Non-Patent Document 1 each disclose a method in which a circuit in which a gate of a transistor for detection is connected to one of a source and a drain of a transistor whose off-state current is to be measured is formed, a change in potential of the one of the source and the drain of the transistor is obtained from a change in resistance value of the transistor for detection, and the off-state current is obtained from the obtained change in potential and a capacitance value of the one of the source and the drain of the transistor.

REFERENCE

Patent Document

Patent Document 1: United States Patent Application Publication No. 2011/0254538
Non-Patent Document 1: Y. Sekine et al., "Success in Measurement the Lowest Off-state Current of Transistor in the World," 2011 *International Conference on Semiconductor Technology for Ultra Large Scale Integrated Circuits and Thin Film Transistors* (2011): pp. 77-88.

SUMMARY OF THE INVENTION

A signal processing device that has a novel circuit configuration and/or a measuring method are/is provided.

Disclosed is a circuit in which a plurality of signal transmission circuits are connected. Each of the signal transmission circuits includes an inverter. At least one of the signal transmission circuits includes a first transistor connected to the inverter and a second transistor one of a source and a drain of which is connected to a gate of the first transistor.

For example, a signal processing device that has the following structure is disclosed: (2n+1) (n is an integer greater than or equal to 1) signal transmission circuits are provided; the signal processing circuits each include an inverter; one of the signal transmission circuits includes a first transistor and a second transistor; one of an input terminal and an output terminal of the inverter is connected to one of a source and a drain of the first transistor; one of a source and a drain of the second transistor is connected to a gate of the first transistor; the other of the input terminal and the output terminal of the inverter is one of an input and an output of the signal transmission circuit; the other of the source and the drain of the first transistor is the other of the input and the output of the signal transmission circuit; an output of a k-th (k is an integer greater than or equal to 1 and less than or equal to 2n) signal transmission circuit is connected to an input of a (k+1)-th signal transmission circuit; and an output of a (2n+1)-th signal transmission circuit is connected to an input of a first signal transmission circuit.

A semiconductor layer in the second transistor may be formed using an oxide. The second transistor may have a structure with which the threshold voltage can be controlled by a back gate.

In addition, a measuring method of the above-described signal processing device that includes a process of measuring an output frequency of any one of the first to the (2n+1)-th signal transmission circuits and measuring the time taken for the frequency to reach a predetermined value after setting the potential of the gate of the first transistor to a first potential that is higher than the threshold voltage; and a process of obtaining the off-state current of the second transistor on the basis of the measured time is disclosed.

In addition, for example, a measuring method that includes a process of obtaining a first physical quantity relating to an off-state current by a first method by applying a potential in a first range to a gate of a transistor and a process of obtaining a second physical quantity relating to an off-state current by a second method by applying a potential in a second range that partly overlaps the first range to the gate of the transistor is disclosed. A coefficient for converting the second physical quantity from the first physical quantity obtained in a region where the first range and the second range overlap each other is obtained.

Note that an off-state current in this specification refers to a current that flows between a source and a drain of a transistor in an off state. For example, in the case of an n-channel transistor, an off-state current refers to a current that flows between a source and a drain of a transistor when a potential of a gate of the transistor is lower than a threshold voltage of the transistor (the potential is in a subthreshold region).

Here, the first physical quantity is, for example, the amount of time required for an oscillation frequency of an ring oscillator including transistors to be reduced to a predetermined frequency, or a current value measured by a normal current measuring instrument.

A low current that cannot be measured by a normal current measuring instrument, for example, a current of 1 fA or lower can be measured. Note that the effect of this disclosure is not limited thereto and is described in detail below.

DETAILED DESCRIPTION OF THE INVENTION

Hereinafter, Embodiments of the present invention will be described in detail with reference to the accompanying drawings. Note that Embodiments of the present invention is not limited to the following description, and it will be easily understood by those skilled in the art that modes and details can be modified in various ways without departing from the spirit and scope of the present invention. Therefore, the contents to be disclosed in this disclosure should not be construed as being limited to the description of Embodiments below.

Note that a "source" of a transistor means a source region that is part of a semiconductor functioning as an active layer or a source electrode that is electrically connected to the semiconductor. Similarly, a "drain" of a transistor means a drain region that is part of a semiconductor functioning as an active layer or a drain electrode that is electrically connected to the semiconductor. A "gate" means a gate electrode.

Transistors in the following description are n-channel transistors; however, the transistors can be p-channel transistors.

Embodiment 1

Figure 1A:
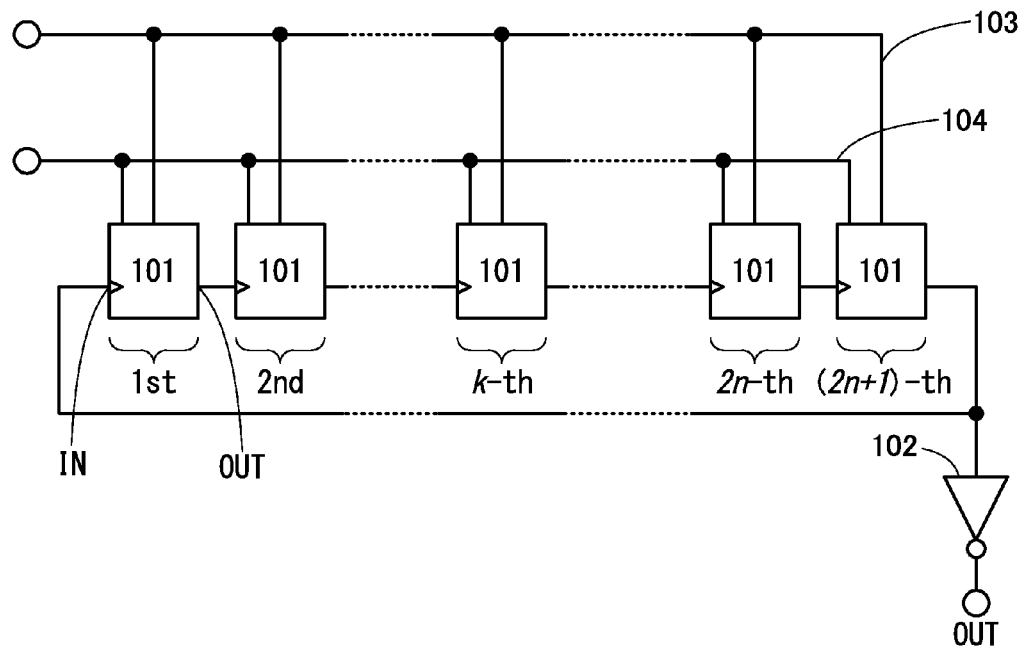
FIGS. 1A and 1B each illustrate an example of a circuit of a signal processing device.

FIG. 1A illustrates an example of a circuit used in a signal processing device. In the circuit, an odd number of signal transmission circuits 101 are connected in series, and an output of the signal transmission circuit 101 in the last ((2n+1)-th) stage is connected to an input of the signal transmission circuit 101 in the first stage. Note that n is an integer greater than or equal to 1. Although the output of the signal transmission circuit 101 in the last ((2n+1)-th) stage is extracted as an output of the circuit in this example, the present invention is not limited thereto. The output of any one of the signal transmission circuits 101 can be extracted as the output of the circuit. Note that an inverter 102 is not necessarily provided.

Each signal transmission circuit 101 is controlled by signals supplied to a wiring 103 and a wiring 104. In the circuit illustrated in FIG. 1A, all of the signal transmission circuits 101 are connected to the wiring 103 and the wiring 104, and thus are controlled at the same time.

Figure 2A:
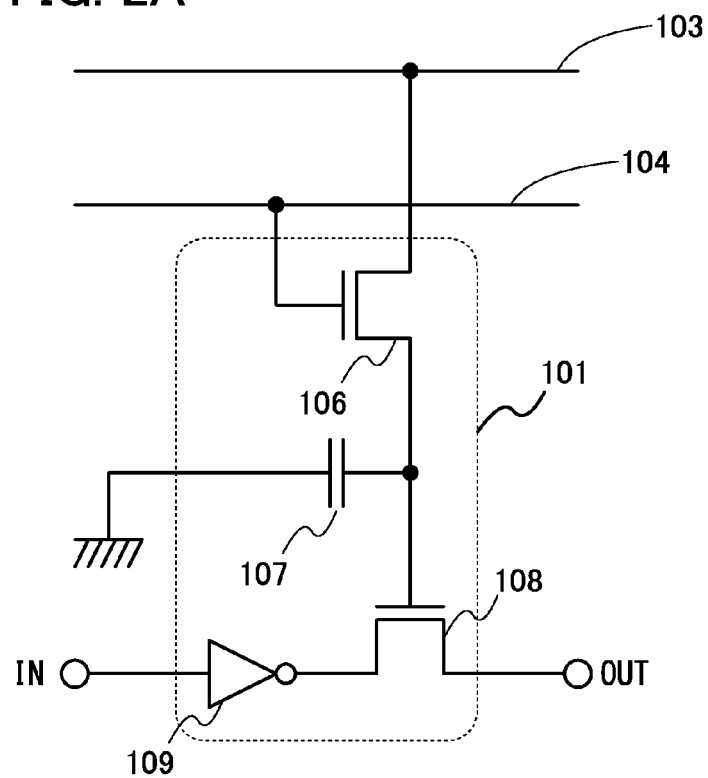
FIGS. 2A and 2B each illustrate an example of a circuit of a signal processing device.

As shown in FIG. 2A, each of the signal transmission circuits 101 includes a measurement transistor 106, a capacitor 107, a load transistor 108, and an inverter 109. Note that the capacitor 107 includes parasitic capacitance as well as a capacitor that is provided intentionally, and includes only parasitic capacitance in some cases.

One of a source and a drain of the measurement transistor 106 is connected to the wiring 103 and the other is connected to one electrode of the capacitor 107 and a gate of the load transistor 108. One of a source and a drain of the load transistor 108 is connected to an output terminal of the inverter 109 and the other serves as an output terminal of the signal transmission circuit 101. An input terminal of the inverter 109 serves as an input terminal of the signal transmission circuit 101. Note that the connection order of the load transistor 108 and the inverter 109 is not limited thereto.

The resistance between the source and the drain of the load transistor 108 depends on the potential of the gate. In the case where the load transistor 108 is an n-channel transistor, the resistance increases with a decrease in the potential of the gate. As illustrated in FIG. 1A and FIG. 2A, the circuit illustrated in FIG. 1A is a ring oscillator in which one load transistor 108 is interposed between two inverters 109. When the resistance of the load transistor 108 increases, the oscillation frequency of the circuit decreases.

When the potential of the gate of the load transistor 108 is set to first potential $V_1$ that is higher than the threshold voltage of the load transistor 108 and the potential of the wiring 103 is set to second potential $V_2$ that is lower than the first potential, the potential of the gate of the load transistor 108 decreases from first potential $V_1$ toward second potential $V_2$ as time passes. The degree of the change depends on the resistance state of the measurement transistor 106 and capacitance C of the capacitor 107.

The resistance state of the measurement transistor 106 depends on the potential of the wiring 104. The potential of the wiring 104 is preferably a potential at which the measurement transistor 106 is in a subthreshold state.

The potential of the gate of the load transistor 108 is preferably set to first potential $V_1$ in the following manner: the potential of the wiring 103 is set to first potential $V_1$ and the potential of the wiring 104 is set to a potential at which the measurement transistor 106 is turned on to charge the capacitor 107 while the power supply potential of the inverter 109 is set to a low-level potential (a ground potential) and the potentials of the source and the drain of the load transistor 108 are set to low-level potentials. Then, the potential of the wiring 104 is set to a potential at which the measurement transistor 106 is in a subthreshold state. In addition, the potential of the wiring 103 is set to second potential $V_2$.

After that, a high potential terminal of power supply terminals of the inverter 109 is set to a high level, so that the circuit illustrated in FIG. 1A starts oscillation. Although the resistance between the source and the drain of the load transistor 108 is low and the oscillation frequency is high at first because the potential of the gate of the load transistor 108 is close to first potential $V_1$, the oscillation frequency decreases as time passes. This is because electric charge leaks from the measurement transistor 106 to decrease the potential of the gate of the load transistor 108.

The oscillation frequency is determined in accordance with the potential of the gate of the load transistor 108. In other words, if the oscillation frequency is predetermined frequency f, the potential of the gate of the load transistor 108 can be determined to be specific potential $V_G$. Note that frequency f may be greater than or equal to 1% and less than or equal to 20% of the initial oscillation frequency.

Thus, current $I_{ds}(V_{gs})$ between the source and the drain of the measurement transistor 106 at the time when the potential difference between the wiring 104 and the wiring 103 is $V_{gs}$ is represented by the following formula.

$$I_{ds}(V_{gs}) = \frac{C \cdot (V_1 - V_G)}{\tau_f(V_{gs})} \quad \text{[Formula 1]}$$

Here, $\tau_f(V_{gs})$ denotes the time taken for the frequency to reach predetermined frequency f from the start of circuit oscillation and is a function of potential difference $V_{gs}$ between the wiring 104 and the wiring 103. Potential difference $V_{gs}$ is changed into various values and $\tau_f(V_{gs})$ corresponding thereto is obtained.

Note that the formula 1 is an approximation formula, and $(V_1-V_G)$ needs to be much smaller than $(V_1-V_2)$ in order to satisfy the formula 1. Thus, $V_2$ is set to be lower than the potential of the source or the drain of the load transistor 108, whereby the measurement accuracy is improved in some cases.

In the formula 1, C, $V_1$, and $V_G$ are constants. If $I_{ds}(V_0)$ at the time when potential difference $V_{gs}$ is $V_0$ can be measured by a normal current measuring instrument and $\tau(V_0)$ at which potential difference $V_{gs}$ is $V_0$ can also be measured, the measurement results by the two different methods are thought to be equal to each other; thus, constant $C \cdot (V_1-V_G)$ can be specified. As a result, potential difference $V_{gs}$ is changed into various values and $\tau_f(V_{gs})$ corresponding thereto is obtained, so that $I_{ds}(V_{gs})$ can be obtained without directly measuring capacitance C or $V_G$.

In general, it takes time to measure the current between a source and a drain in the case where the measurement transistor 106 has high off-state resistance. The time is proportional to the capacitance of the capacitor 107; thus, it is effective to make the capacitance of the capacitor 107 as low as possible for shortening the measurement time.

Meanwhile, when the capacitance of the capacitor 107 decreases, the proportion of parasitic capacitance in the capacitor 107 increases. It is difficult to accurately specify the parasitic capacitance from a wiring shape as well as to measure the parasitic capacitance; thus, the decrease in the capacitance of the capacitor 107 for shortening the measurement time results in a lower degree of measurement accuracy.

In contrast, in the above-described method, capacitance C is not directly measured; thus, the measurement time can be shortened while the measurement accuracy is maintained even if the capacitance of the capacitor 107 is sufficiently low.

For example, two kinds of measurement circuits, a first circuit and a second circuit, are manufactured. Capacitance $C_1$ of the capacitor 107 in the first circuit is sufficiently high, while capacitance $C_2$ of the capacitor 107 in the second circuit is sufficiently low. However, the values of capacitance $C_1$ and capacitance $C_2$ are unknown. The following formula 2 and formula 3 are obtained from the formula 1. Note that a boosting effect of the potential of the gate due to the potential of the source or the drain of the load transistor is ignored here.

Note that although the oscillation frequencies of the circuits and the potentials of the gates of the load transistors can be determined regardless of the capacitance as long as conditions other than the capacitance are the same, the values of $V_{G1}$ and $V_{G2}$ are unknown here.

$$I_{ds}(V_{gs}) = \frac{C_1 \cdot (V_1 - V_{G1})}{\tau_{1f}(V_{gs})} \qquad \text{[Formula 2]}$$

$$I_{ds}(V_{gs}) = \frac{C_2 \cdot (V_1 - V_{G2})}{\tau_{2f}(V_{gs})} \qquad \text{[Formula 3]}$$

Capacitance $C_2$ in the first circuit is high; thus, measurement using the first circuit can be performed with a high degree of accuracy even in the case where the current between the source and the drain of the measurement transistor 106 is relatively high (potential difference $V_{gs}$ is large). For the same reason, measurement using the first circuit takes a long time in the case where the current between the source and the drain is relatively low (potential difference $V_{gs}$ is small).

In contrast, capacitance $C_2$ in the second circuit is low; thus, the degree of accuracy of measurement using the second circuit is low in the case where the current between the source and the drain of the measurement transistor 106 is relatively high. For the same reason, measurement using the second circuit can be performed in a shorter time even in the case where the current between the source and the drain is relatively low.

Since the range of potential difference $V_{gs}$ that can be measured using the first circuit overlaps the range of potential difference $V_{gs}$ that can be measured by a normal current measuring instrument, constant $C_1 \cdot (V_1 - V_G)$ can be specified by the above-described method. In addition, assume that measurement is performed using the first circuit and the second circuit with a sufficiently high degree of accuracy in a relatively short time at potential difference $V_{gs}$ of $V_3$ to obtain $\tau_{1f}(V_3)$ and $\tau_{2f}(V_3)$ by the measurement using the first circuit and the measurement using the second circuit, respectively.

At this time, currents $I_{ds}(V_3)$ measured using the two circuits are regarded as being equivalent to each other if conditions other than capacitance $C_1$ and capacitance $C_2$ are the same. Thus, the ratio of constant $C_1 \cdot (V_1 - V_{G1})$ to constant $C_2 \cdot (V_1 - V_{G2})$ can be determined from the formula 2 and the formula 3.

Since constant $C_1 \cdot (V_1 - V_{G1})$ of the first circuit is already specified, constant $C_2 \cdot (V_1 - V_{G2})$ of the second circuit is also specified. In other words, current $I_{ds}(V_{gs})$ can also be obtained from results of the measurement using the second circuit. In addition, the use of the second circuit enables the measurement to be completed in a relatively short time even when the measurement using the first circuit takes a long time.

Assumed that, for example, the measurement using the first circuit takes 10000 seconds and the measurement using the second circuit takes 100 seconds when $C_1/C_2$ is 100 and potential difference $V_{gs}$ is $V_3$. In the case where the current between the source and the drain of the measurement transistor 106 is decreased by two digits, the measurement using the first circuit takes 1000000 seconds, which corresponds to 11.5 days; however, the measurement using the second circuit takes only 10000 seconds, which corresponds to 2.78 hours. Thus, the second circuit is suitable for measuring small current values.

In the case where the current between the source and the drain of the measurement transistor 106 is higher by two digits than that measured at potential difference $V_{gs}$ of $V_3$, the measurement using the second circuit needs to be completed in 1 second and the degree of measurement accuracy is significantly low. In contrast, the measurement using the first circuit can be completed in 100 seconds; thus, the degree of measurement accuracy is sufficiently high. Thus, the first circuit is suitable for measuring large current values.

The example of the method of measuring the current between the source and the drain of the measurement transistor 106 by using two circuits having different capacitance of the capacitors 107 is described above; however, similar measurement may be performed using three or more circuits having different capacitance of the capacitors 107.

Figure 2B:
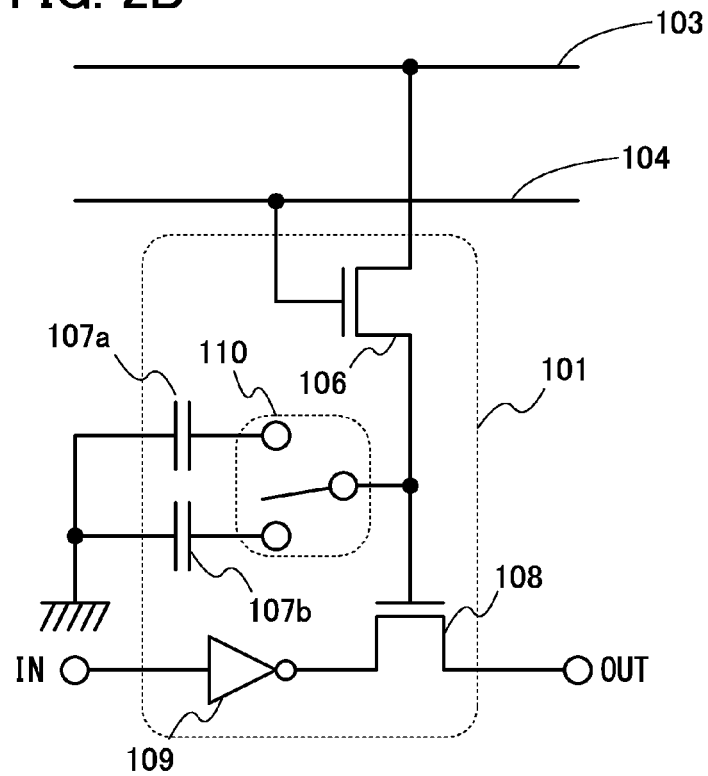

Alternatively, as illustrated in FIG. 2B, two capacitors with a small and large sizes (a capacitor 107a and a capacitor 107b) may be prepared instead of preparing different two circuits and the capacitor to be connected to the gate of the load transistor 108 may be selected by a switch 110. The switch 110 may be a transistor or a mechanical switch.

Alternatively, even in the case where one circuit is used, two types of measurement in which threshold values of frequencies are different may be combined. For example, in the first measurement, time $\tau_{f=0.1\ MHz}(V_{gs})$ taken for an oscillation frequency to decrease to 0.1 MHz from the start of oscillation is obtained for each $V_{gs}$. Note that the time for measurement increases with a decrease in $V_{gs}$; thus, $V_{gs}$ is, for example, in the range of −0.3 V to 0 V. In a manner similar to the above, current $I_{ds}(0)$, for example, at $V_{gs}$ of 0 V can be measured by a normal current measuring instrument and capacitance C can be obtained.

In this measurement, the relation represented by the following formula 4 is satisfied. Note that potential $V_{G3}$ of the gate of the load transistor 108 at an oscillation frequency of 0.1 MHz is unknown.

$$I_{ds}(V_{gs}) = \frac{C \cdot (V_1 - V_{G3})}{\tau_{f=0.1MHz}(V_{gs})} \quad \text{[Formula 4]}$$

In the next measurement, time $\tau_{f=1\,MHz}(V_{gs})$ taken for an oscillation frequency to decrease to 1 MHz from the start of oscillation is obtained for each $V_{gs}$. Note that the degree of measurement accuracy decreases with an increase in $V_{gs}$; thus, $V_{gs}$ is, for example, in the range of −0.5 V to −0.2 V.

In this measurement, the relation represented by the following formula 5 is satisfied. Note that potential $V_{G4}$ of the gate of the load transistor 108 at an oscillation frequency of 1 MHz is unknown.

$$I_{ds}(V_{gs}) = \frac{C \cdot (V_1 - V_{G4})}{\tau_{f=1MHz}(V_{gs})} \quad \text{[Formula 5]}$$

Since $V_{gs}$ in the first measurement and $V_{gs}$ in the second measurement overlap each other in the range of −0.3 V to −0.2 V, the current values at $V_{gs}$ in this range (e.g., $V_{gs}=-0.25$ V) measured by the methods can be estimated to be equivalent to each other. That is, the relation represented by the following formula 6 is obtained.

$$I_{ds}(0.25V) = \frac{C \cdot (V_1 - V_{G3})}{\tau_{f=0.1MHz}(-0.25V)} = \frac{C \cdot (V_1 - V_{G4})}{\tau_{f=1MHz}(-0.25V)} \quad \text{[Formula 6]}$$

In other words, the ratio (coefficient) of $(V_1-V_{G3})$ to $(V_1-V_{G4})$ is determined. The value of the current between the source and the drain of the measurement transistor 106 can be accurately obtained using the coefficient.

Figure 1B:
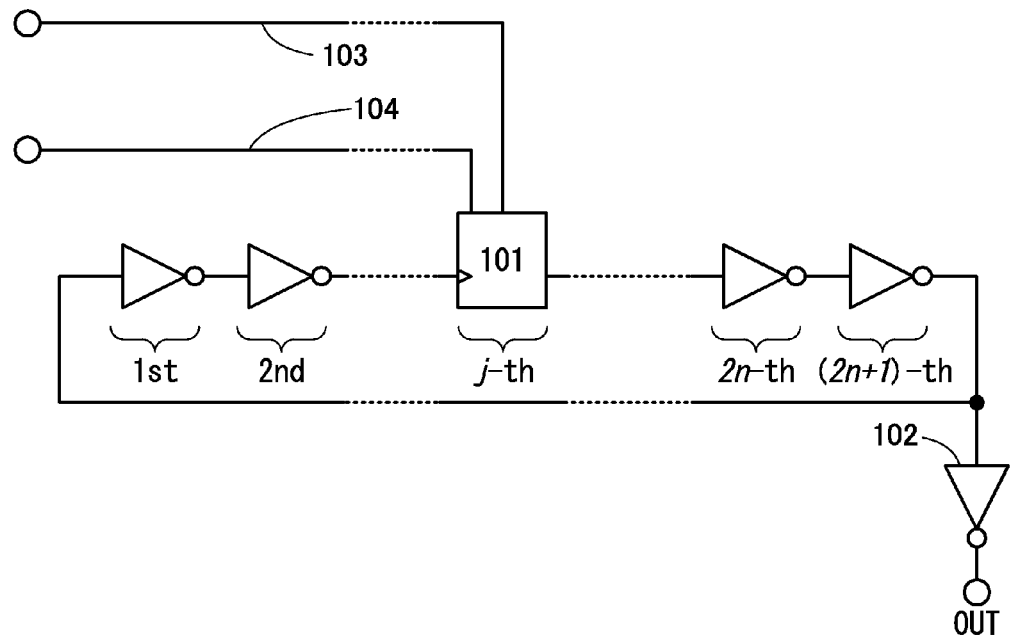

FIG. 1B illustrates another example of a circuit used in a signal processing device. In the circuit illustrated in FIG. 1B, only the signal transmission circuit 101 in a j-th stage of the signal transmission circuits 101 in (2n+1) stages includes the circuit illustrated in FIG. 2A, and the other circuits include only inverters. Note that j is an integer greater than or equal to 1 and less than or equal to (2n+1).

Note that the signal transmission circuit that includes only the inverter can be regarded as a circuit formed by removing the measurement transistor 106 and the capacitor 107 from the signal transmission circuit 101 illustrated in FIG. 2A and in which the source and the drain of the load transistor 108 are short-circuited.

Results including the currents between the sources and the drains of the measurement transistors 106 in all of the signal transmission circuits 101 are obtained in the case of the circuit illustrated in FIG. 1A, while results including the current between the source and the drain of the measurement transistor 106 in the j-th signal transmission circuit 101 are obtained in the case of the circuit illustrated in FIG. 1B. Note that two or more and 2n or less signal transmission circuits 101 may be provided in the circuit.

An oxide semiconductor that can be used for the measurement transistor 106 or the like is described.

The oxide semiconductor contains, for example, indium. An oxide semiconductor containing indium has high carrier mobility (electron mobility). An oxide semiconductor preferably contains an element M. The element M is, for example, aluminum, gallium, yttrium, or tin. The element M is an element having a high bonding energy with oxygen, for example. In addition, the oxide semiconductor preferably contains zinc. When containing zinc, the oxide semiconductor is likely to be crystalline. The energy at the top of the valence band (Ev) of the oxide semiconductor can be controlled by, for example, the atomic ratio of zinc, in some cases.

The oxide semiconductor does not necessarily contain indium. The oxide semiconductor may be, for example, a Zn—Sn oxide or a Ga—Sn oxide.

The oxide semiconductor may be In-M-Zn oxide having any of the following atomic ratios of In to M when summation of In and M is assumed to be 100 atomic %: the atomic percentage of In is smaller than 50 atomic % and the atomic percentage of M is larger than or equal to 50 atomic %, and the atomic percentage of In is smaller than 25 atomic % and the atomic percentage of M is larger than or equal to 75 atomic %. In addition, the oxide semiconductor may be In-M-Zn oxide having any of the following atomic ratios of In to M when summation of In and M is assumed to be 100 atomic %: the atomic percentage of In is larger than or equal to 25 atomic % and the atomic percentage of M is smaller than 75 atomic %, and the atomic percentage of In is larger than or equal to 34 atomic % and the atomic percentage of M is smaller than 66 atomic %.

The oxide semiconductor has a large energy gap. The energy gap of the oxide semiconductor is greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV.

In order to obtain stable electrical characteristics of a transistor, it is effective to reduce the concentration of impurities in the oxide semiconductor so that the oxide semiconductor is highly purified to be intrinsic. In the oxide semiconductor, a light element, a metalloid element, a metal element, or the like (lower than 1 atomic %) other than main components serves as an impurity. For example, hydrogen, lithium, carbon, nitrogen, fluorine, sodium, silicon, chlorine, potassium, calcium, titanium, iron, nickel, copper, germanium, strontium, zirconium, and hafnium might be impurities to the oxide. Thus, the concentration of impurities in an adjacent film is preferably reduced.

For example, in some cases, silicon in an oxide semiconductor forms impurity states. In addition, in some cases, silicon at the surface of an oxide semiconductor forms impurity states. The concentration of silicon in an oxide semiconductor or at the surface of an oxide semiconductor, which is measured by secondary ion mass spectrometry (SIMS), is lower than $1\times10^{19}$ atoms/cm$^3$, preferably lower than $5\times10^{18}$ atoms/cm$^3$, further preferably lower than $2\times10^{18}$ atoms/cm$^3$.

In some cases, hydrogen in an oxide semiconductor forms impurity states, whereby carrier density is increased. Thus, the concentration of hydrogen in the oxide semiconductor film, which is measured by SIMS, can be set to lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. In addition, in some cases, nitrogen in an oxide semiconductor forms impurity states, whereby carrier density is increased. Thus, the concentration of nitrogen in the oxide semiconductor, which is measured by SIMS, can be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

An oxide semiconductor may include, for example, a non-single-crystal. The non-single-crystal is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is 100 nm, for example. In an image obtained with a TEM, a boundary between the crystal parts in the CAAC-OS is not clearly observed in some cases. In addition, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31 degrees which shows alignment appears in some cases. In addition, for example, spots (luminescent spots) are observed in an electron diffraction pattern of the CAAC-OS in some cases. An electron diffraction pattern obtained with an electron beam having a beam diameter of 10 nmϕ or smaller, or 5 nmϕ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

In addition, the CAAC-OS can be formed by, for example, reducing the density of defect states. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has a small variation in electrical characteristics and high reliability in some cases. A charge trapped by the trap states in the oxide semiconductor takes a long time to disappear. The trapped charge may behave like a fixed charge. Thus, the transistor that includes the oxide semiconductor having a high density of trap states in the channel formation region has unstable electrical characteristics in some cases.

With the use of the highly purified intrinsic or substantially highly purified intrinsic CAAC-OS in a transistor, variation in the electrical characteristics of the transistor due to irradiation with visible light or ultraviolet light is small.

An oxide semiconductor may include, for example, polycrystal. Note that an oxide semiconductor including polycrystal is referred to as a polycrystalline oxide semiconductor. A polycrystalline oxide semiconductor includes a plurality of crystal grains.

An oxide semiconductor may include, for example, microcrystal. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is, for example, greater than or equal to 1 nm and less than or equal to 100 nm, or greater than or equal to 1 nm and less than or equal to 10 nm. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly observed in some cases. In an image of the nc-OS obtained with a TEM, for example, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has a periodic atomic order occasionally. In addition, for example, in the nc-OS, crystal parts are not regularly arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than the diameter of a crystal part, a peak that shows alignment does not appear in some cases. In addition, for example, a halo pattern is observed in some cases in an electron diffraction pattern of the nc-OS obtained by using an electron beam having a beam diameter larger than the diameter of a crystal part (e.g., a beam diameter of 20 nmϕ or more, or 50 nmϕ or more). For example, spots are observed in some cases in a nanobeam electron diffraction pattern of the nc-OS obtained by using an electron beam having a beam diameter smaller than or equal to the diameter of a crystal part (for example, a beam diameter of 10 nmϕ or less, or 5 nmϕ or less). In a nanobeam electron diffraction pattern of the nc-OS, for example, regions with high luminance in a circular pattern are observed in some cases. In a nanobeam electron diffraction pattern of the nc-OS, for example, a plurality of spots is observed in the region in some cases.

Since the microscopic region in the nc-OS has a periodic atomic order occasionally, the nc-OS has lower density of defect states than the amorphous oxide semiconductor. Note that since crystal parts in the nc-OS are not regularly arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

The oxide semiconductor may be a multilayer film. For example, a multilayer film in which an oxide semiconductor layer S1 and an oxide semiconductor layer S2 are formed in this order may be used.

In this case, the conduction band edge (Ec) of the oxide semiconductor layer S2 is made lower than that of the oxide semiconductor layer S1, for example. Specifically, for the oxide semiconductor layer S2, an oxide semiconductor having higher electron affinity than the oxide semiconductor layer S1 by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity refers to an energy gap between the vacuum level and the bottom of the conduction band.

Alternatively, the energy gap of the oxide semiconductor layer S2 is made smaller than that of the oxide semiconductor layer S1, for example. The energy gap can be obtained by, for example, an optical method. Specifically, for the oxide semiconductor layer S2, an oxide semiconductor having smaller energy gap than the oxide semiconductor layer S1 by greater than or equal to 0.1 eV and smaller than or equal to 1.2 eV or by greater than or equal to 0.2 eV and smaller than or equal to 0.8 eV is used.

Alternatively, the oxide semiconductor may be, for example, a multilayer film in which the oxide semiconductor layer S1, the oxide semiconductor layer S2, and an oxide semiconductor layer S3 are formed in this order.

For example, the energy (Ec) at the bottom of the conduction band of the oxide semiconductor layer S2 is made lower than that of the oxide semiconductor layer S1 and the oxide semiconductor layer S3. Specifically, for the oxide semiconductor layer S2, an oxide semiconductor having higher electron affinity than the oxide semiconductor layers S1 and S3 by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used.

Alternatively, for example, the energy gap of the oxide semiconductor layer S2 is made smaller than that of each of the oxide semiconductor layers S1 and S3. Specifically, for the oxide semiconductor layer S2, an oxide semiconductor having smaller energy gap than the oxide semiconductor layers S1 and S3 by greater than or equal to 0.1 eV and smaller than or equal to 1.2 eV or by greater than or equal to 0.2 eV and smaller than or equal to 0.8 eV is used.

To increase the on-state current of a top-gate transistor, for example, the thickness of the oxide semiconductor layer S3 is preferably as small as possible. The thickness of the oxide semiconductor layer S3 is set to, for example, less than 10 nm, preferably less than or equal to 5 nm, further preferably less than or equal to 3 nm. On the other hand, the oxide semiconductor layer S3 is preferably not too thin because it blocks entry of elements (e.g., silicon) contained in a gate insulating film to the oxide semiconductor layer S2 having a high current density. The thickness of the oxide semiconductor layer S3 is, for example, greater than or equal to 0.3 nm, preferably greater than or equal to 1 nm, further preferably greater than or equal to 2 nm.

It is preferable that the oxide semiconductor layer S1 be thick and the oxide semiconductor layers S2 and S3 be thin. Specifically, the thickness of the oxide semiconductor layer S1 is greater than or equal to 20 nm, preferably greater than or equal to 30 nm, further preferably greater than or equal to 40 nm, still further preferably greater than or equal to 60 nm. In such a case, the interface between an insulating film and the oxide semiconductor layer S1 can be separated from the oxide semiconductor layer S2 having a high current density, with a distance of 20 nm or more, preferably 30 nm or more, further preferably 40 nm or more, still further preferably 60 nm or more. Note that to prevent the productivity of the signal processing device from being lowered, the thickness of the oxide semiconductor layer S1 is smaller than or equal to 200 nm, preferably smaller than or equal to 120 nm, further preferably smaller than or equal to 80 nm. The thickness of the oxide semiconductor layer S2 is greater than or equal to 3 nm and less than or equal to 100 nm, preferably greater than or equal to 3 nm and less than or equal to 80 nm, further preferably greater than or equal to 3 nm and less than or equal to 50 nm.

For example, the thickness of the oxide semiconductor layer S1 may be greater than that of the oxide semiconductor layer S2, and the thickness of the oxide semiconductor layer S2 can be greater than that of the oxide semiconductor layer S3.

A single layer or a multilayer of the above-described oxide semiconductor can be used for a channel of the measurement transistor 106 or the like.

Embodiment 2

Figure 3A:
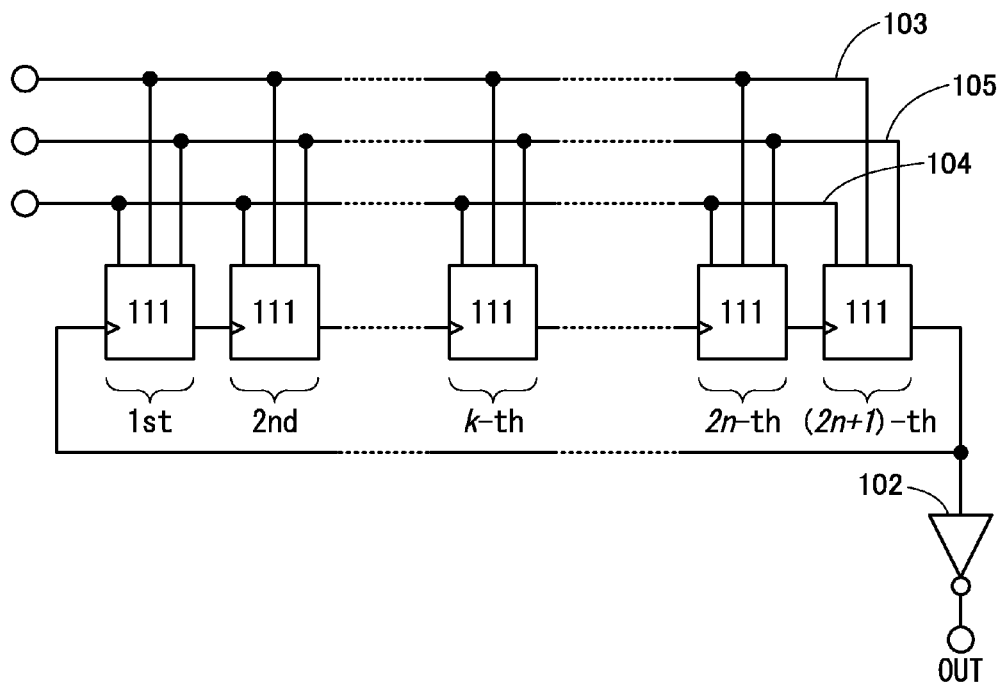
FIGS. 3A and 3B each illustrate an example of a circuit of a signal processing device.

FIG. 3A illustrates another example of a circuit used in a signal processing device. In the circuit illustrated in FIG. 3A, an odd number of signal transmission circuits 111 are connected in series, and an output of the signal transmission circuit 111 in the last ((2n+1)-th) stage is connected to an input of the signal transmission circuit 111 in the first stage. Note that n is an integer greater than or equal to 1. Although the output of the signal transmission circuit 111 in the last ((2n+1)-th) stage is extracted as an output of the circuit in this example, the present invention is not limited thereto. The output of any one of the signal transmission circuits 111 can be extracted as the output of the circuit. Note that an inverter 102 is not necessarily provided.

Each signal transmission circuit 111 is controlled by signals supplied to the wiring 103, the wiring 104, and a wiring 105. In the circuit illustrated in FIG. 3A, all of the signal transmission circuits 111 are connected to the wiring 103, the wiring 104, and the wiring 105, and thus are controlled at the same time.

Figure 4A:
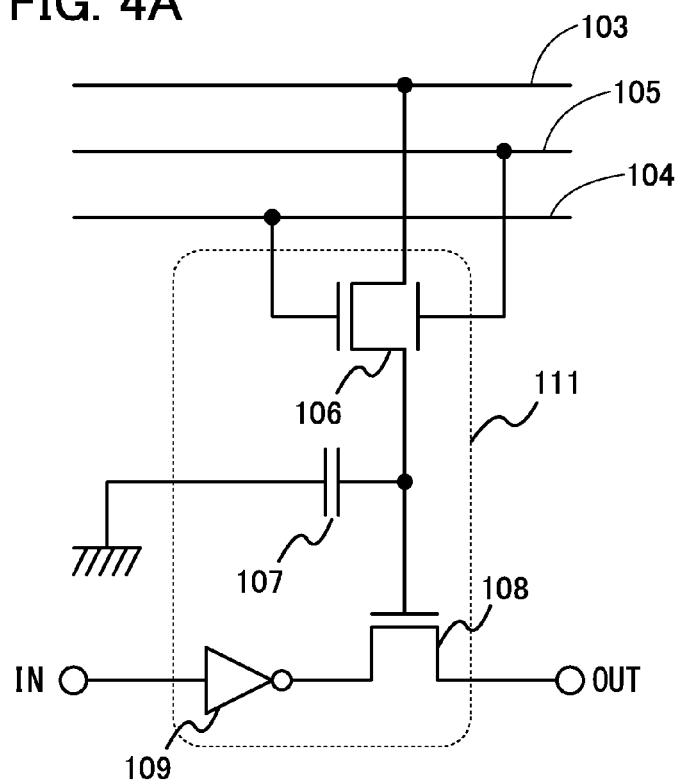
FIGS. 4A and 4B each illustrate an example of a circuit of a signal processing device.

As shown in FIG. 4A, each of the signal transmission circuits 111 includes the measurement transistor 106, the capacitor 107, the load transistor 108, and the inverter 109. Note that the capacitor 107 includes parasitic capacitance as well as a capacitor that is provided intentionally, and includes only parasitic capacitance in some cases. In addition, the measurement transistor 106 includes a back gate.

Connections other than a connection of the back gate of the measurement transistor 106 are the same as those in the signal transmission circuit 101 illustrated in FIG. 2A. In the signal transmission circuit 111, the back gate of the measurement transistor 106 is connected to the wiring 105. Thus, the conduction state between the source and the drain of the measurement transistor 106 varies depending on the potential of the wiring 105 as well as the potential of the wiring 104.

Figure 3B:
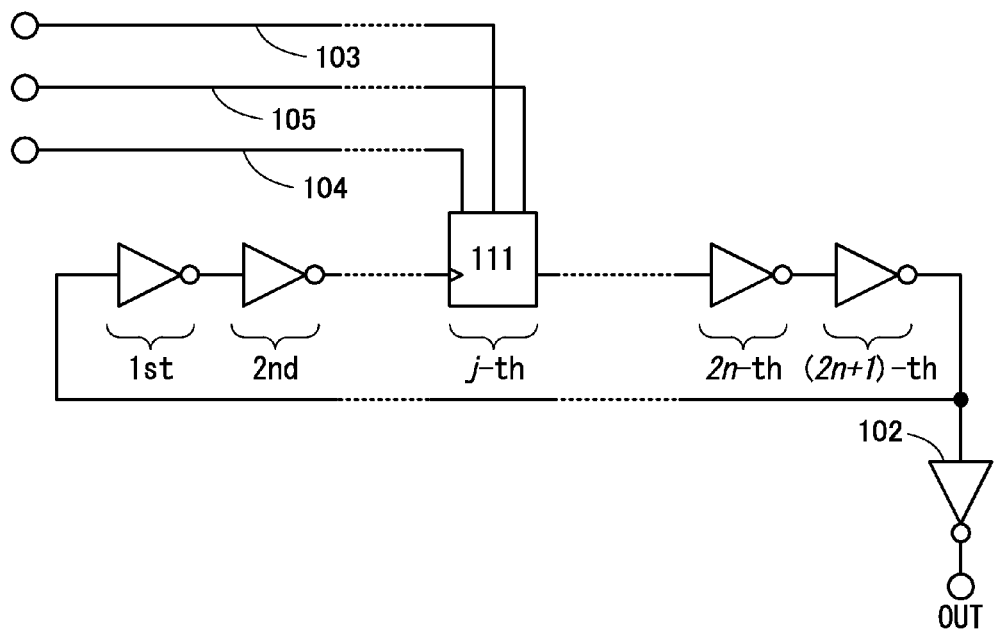
Figure 4B:
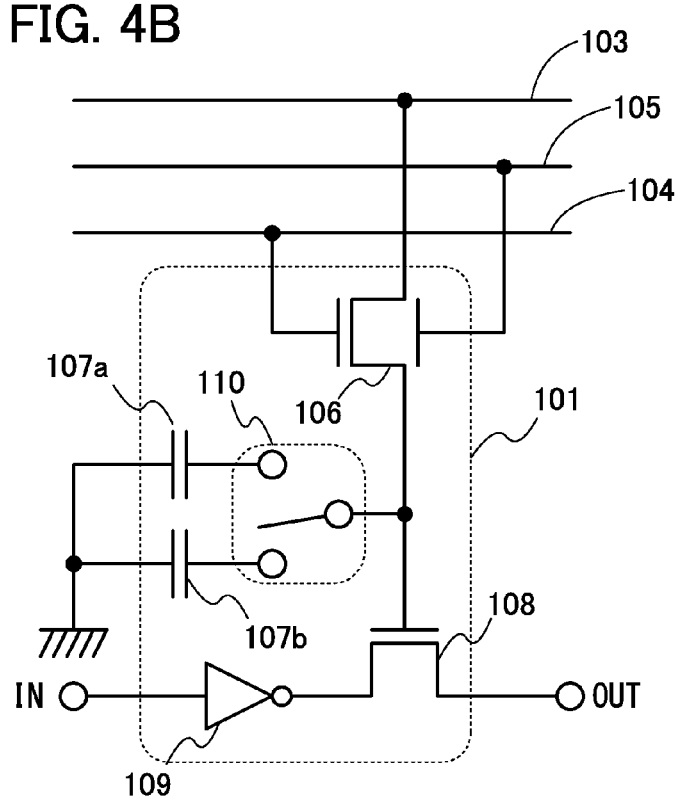

Alternatively, as illustrated in FIG. 3B, only a signal transmission circuit in a j-th stage may be the signal transmission circuit 111 and the other signal transmission circuits may include only inverters. As illustrated in FIG. 4B, the switch 110 may be provided between the gate of the load transistor 108 and the capacitor 107a or the capacitor 107b. The contents disclosed in Embodiment 1 may be applied to this embodiment as appropriate.

A measuring method using the circuit illustrated in FIG. 3A is described. As described in Embodiment 1, the potential of the gate of the load transistor 108 is set to $V_1$ and then power is supplied to the inverter 109, whereby oscillation starts. Then, when the potential of the gate of the load transistor 108 decreases to $V_G$, an oscillation frequency decreases to f. In the case of the measurement transistor 106 including the back gate, the following formula 7 is satisfied.

$$I_{ds}(V_{gs}, V_{BG}) = I_{ds}(V_{gs} - \Delta V_{gs}(V_{BG}))$$ [Formula 7]

As shown in the formula, the current between the source and the drain of the measurement transistor 106 is a function of potential difference $V_{gs}$ and potential difference $V_{BG}$ between the back gate and the wiring 103. Note that $\Delta V_{gs}(V_{BG})$ is a function of potential difference $V_{BG}$. For example, $\Delta V_{gs}(V_{BG})$ can be determined depending on variation in threshold voltage of the measurement transistor 106 at the time when predetermined potential difference $V_{BG}$ is applied.

Here, when $V_{gs}$ is 0, current $I_{ds}(0, V_{BG})$ between the source and the drain of the measurement transistor 106 is represented by the following formula 8.

$$I_{ds}(0, V_{BG}) = I_{ds}(-\Delta V_{gs}(V_{BG})) = \frac{C \cdot (V_1 - V_G)}{\tau_f(0, V_{BG})}$$ [Formula 8]

Here, $\tau_f(0, V_{BG})$ denotes the time taken for the frequency to reach frequency f from the start of circuit oscillation and is a function of potential difference $V_{BG}$. Potential difference $V_{gs}$ is a fixed to 0, potential difference $V_{BG}$ is changed into various values, and $\tau_f(0, V_{BG})$ corresponding thereto is obtained. Note that although the time taken for the frequency to reach frequency f from the start of circuit oscillation is a function of potential difference $V_{gs}$, the time depends on only potential difference $V_{BG}$ because $V_{gs}$ is 0 here.

As described in Embodiment 1, even if the capacitance of the capacitor 107 or potential $V_G$ is not measured, constant $C \cdot (V_1 - V_G)$ can be specified as long as current value $I_{ds}(0, V_0)$ can be measured by a normal current measuring instrument at potential difference $V_{gs}$ of 0 and potential difference $V_{BG}$ of $V_0$, and $\tau_f(0, V_0)$ at which potential difference $V_{gs}$ is 0 and potential difference $V_{BG}$ is $V_0$ can be obtained. As a result, $I_{ds}(0, V_{BG})$ can be obtained without directly measuring capacitance C or $V_G$.

In addition, if the relation between $V_{BG}$ and the threshold voltage of the measurement transistor 106 is known, $V_{BG}$ can be converted into $V_{gs}$.

Note that although the potential of the gate of the measurement transistor 106 is fixed and the potential of the back gate is changed in the above description, the potential of the back gate may be fixed and the potential of the gate may be changed.

Embodiment 3

Figure 5A:
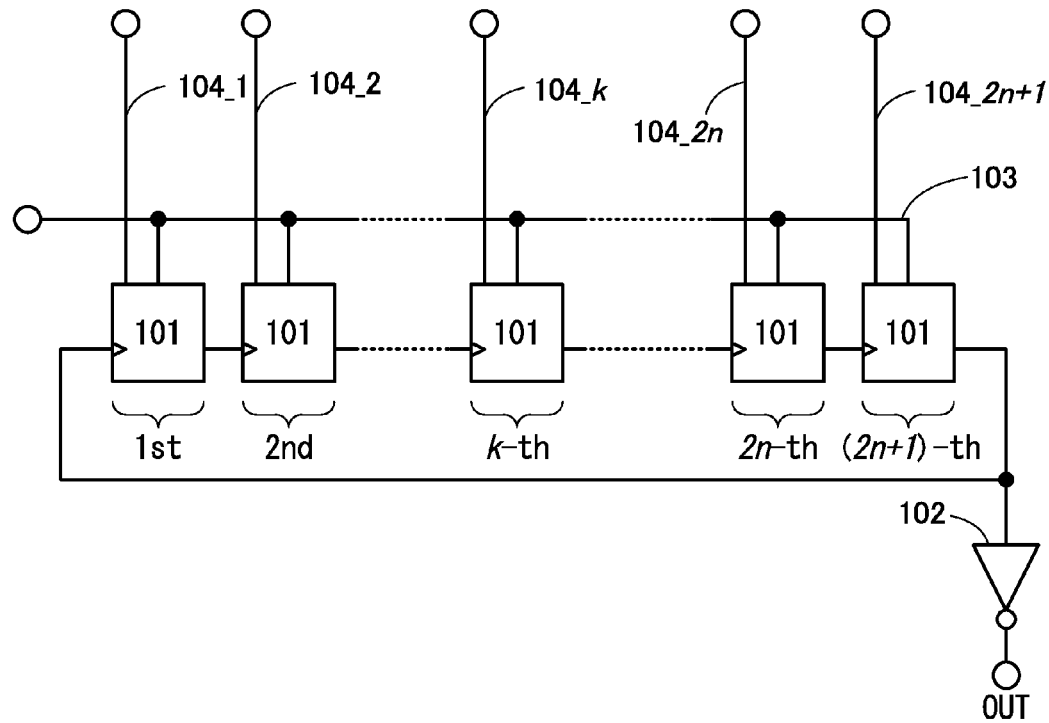
FIGS. 5A and 5B each illustrate an example of a circuit of a signal processing device.

FIG. 5A illustrates an example of a signal processing device. In the signal processing device illustrated in FIG. 5A, an odd number of signal transmission circuits 101 are connected as described in Embodiment 1 or with reference to FIG. 1A and FIG. 2A; however, unlike Embodiment 1 or FIG. 1A, the wirings 104 connected to the respective signal transmission circuits 101 can be controlled separately.

Thus, the measurement transistors 106 in the signal transmission circuits 101 can be separately turned on and off, and signals are supplied to the wiring 103 at different timings, whereby the potentials of the load transistors 108 can be controlled separately.

In addition, the measurement transistors 106 in the signal transmission circuits 101 can be separately turned off. For example, sufficiently low potentials are supplied to the gates of the measurement transistors 106 in the signal transmission circuits 101 other than the signal transmission circuit 101 in a k-th stage and only the potential supplied to the gate of the measurement transistor 106 in the signal transmission circuit 101 in the k-th stage can be used as a potential for measurement. Note that k is an integer greater than or equal to 1 and less than or equal to (2n+1).

In that case, the potentials of the gates of the load transistors 108 hardly decrease in the signal transmission circuits 101 other than the signal transmission circuit 101 in the k-th stage; thus, the load transistors 108 can be practically used as resistance that does not change with time.

In contrast, in the signal transmission circuit 101 in the k-th stage, the potential of the gate of the load transistor 108 decreases with time; thus, the circuit oscillation frequency practically changes with a change in resistance of the load transistor 108 in the signal transmission circuit 101 in the k-th stage.

Figure 5B:
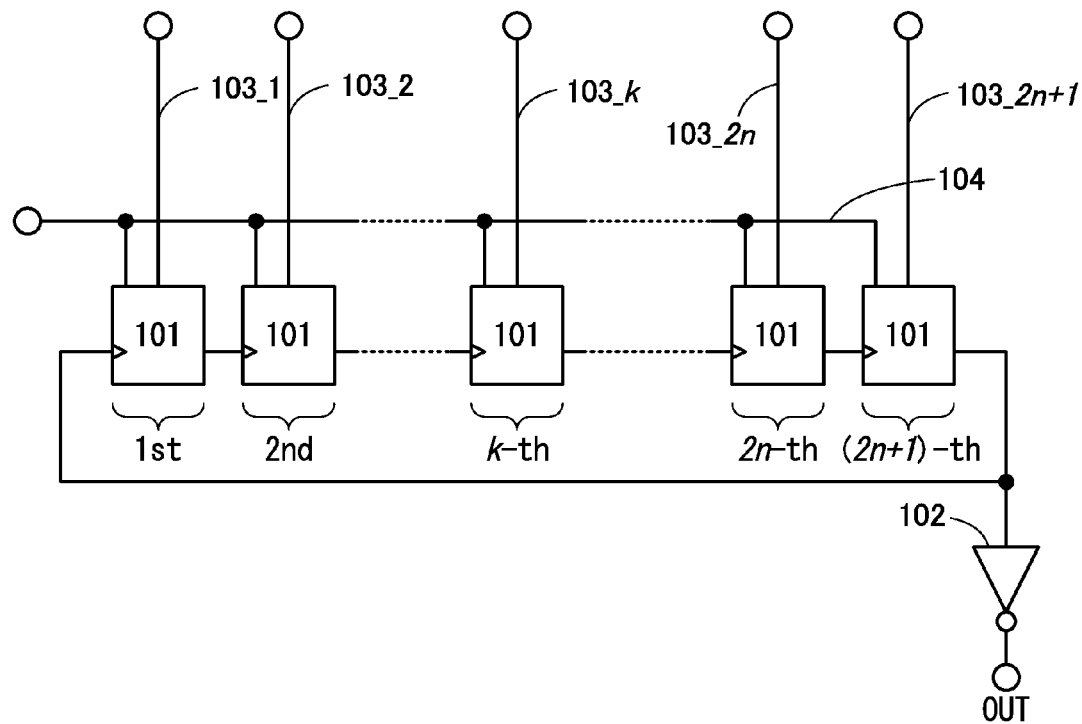

In an example of a circuit illustrated in FIG. 5B, an odd number of signal transmission circuits 101 are connected as described in Embodiment 1 or with reference to FIG. 1A and FIG. 2A; however, unlike Embodiment 1 or FIG. 1A, the wirings 103 connected to the respective signal transmission circuits 101 can be controlled separately.

For example, only the potential of a wiring 103_k connected to the signal transmission circuit 101 in a k-th stage at the time of oscillation is set to second potential $V_2$ and the potentials of the wirings 103 connected to the signal transmission circuits 101 in the other stages are each set to first potential $V_1$, whereby the potentials of the gates of the load transistors 108 in the signal transmission circuits 101 other than the signal transmission circuit 101 in the k-th stage are maintained at potential $V_1$ regardless of the potential of the wiring 104. Note that k is an integer greater than or equal to 1 and less than or equal to (2n+1). Thus, the load transistors 108 in the signal transmission circuits 101 other than the signal transmission circuit 101 in the k-th stage can be practically used a resistance that does not change with time.

In contrast, the potential of the gate of the load transistor 108 in the signal transmission circuit 101 in the k-th stage decreases from the potential $V_1$ as time passes; thus, the oscillation frequency of the circuit practically changes because of a change in resistance of the load transistor 108 in the signal transmission circuit 101 in the k-th stage.

Embodiment 4

An example of a manufacturing process of a signal processing device is described with reference to FIGS. 6A to 6D. For the details, Patent Document 1 can be referred to. Note that FIGS. 6A to 6D simply illustrate a stacked-layer structure and do not necessarily illustrate cross sections of a specific portion.

Figure 6A:
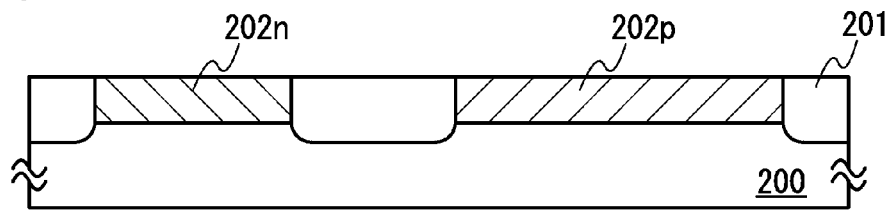
FIGS. 6A to 6D illustrate an example of a manufacturing process of a signal processing device.

An element separation insulator 201, a p-well 202p, and an n-well 202n are provided in a single-crystal, polycrystalline, or amorphous semiconductor substrate 200 (FIG. 6A).

Figure 6B:
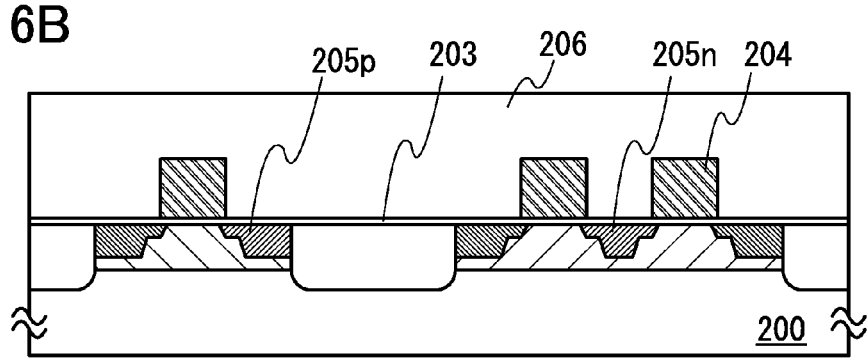

A first gate insulating film 203 and a first gate wiring 204 are formed; an n-type impurity region 205n is formed in the p-well 202p and a p-type impurity region 205p is formed in the n-well 202n; and a first interlayer insulator 206 is provided (FIG. 6B). The first interlayer insulator 206 is a single layer or a multilayer and is preferably capable of supplying oxygen to an upper layer and blocking the transfer of hydrogen or water from a lower layer to the upper layer.

Figure 6C:
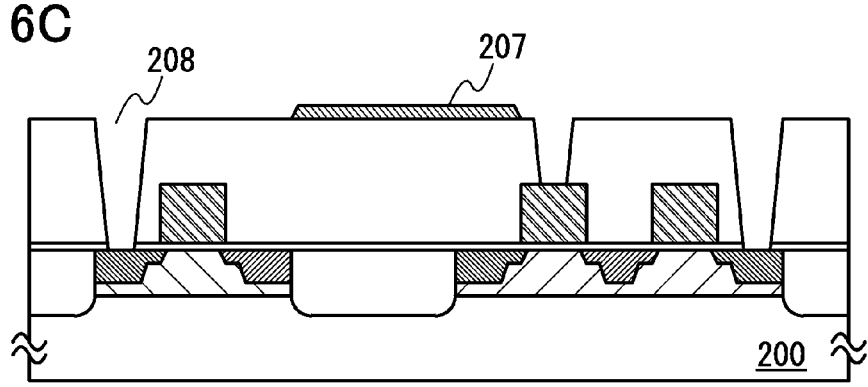

An oxide semiconductor layer 207 is provided over the first interlayer insulator 206, and a contact hole 208 is formed in the first interlayer insulator 206 (FIG. 6C). Note that a semiconductor other than an oxide semiconductor may be used. For example, a silicon film with a thickness of 2 nm or less may be used.

A conductive material is deposited to fill the contact hole. The oxide semiconductor layer 207 is covered with the conductive material. The conductive material is a single layer or a multilayer. Furthermore, the surface of the conductive material is planarized and an insulating material with a thickness of 100 nm or more is formed thereover. The insulating material is a single layer or a multilayer and is preferably capable of blocking the transfer of hydrogen or water from an upper layer to a lower layer.

Then, the conductive material and the insulating material are selectively etched to form a wiring 209 and a second interlayer insulator 210, respectively. The wiring 209 and the second interlayer insulator 210 have similar shapes. In this etching, the conductive material is preferably used as an etching stopper of the insulating material.

Figure 6D:
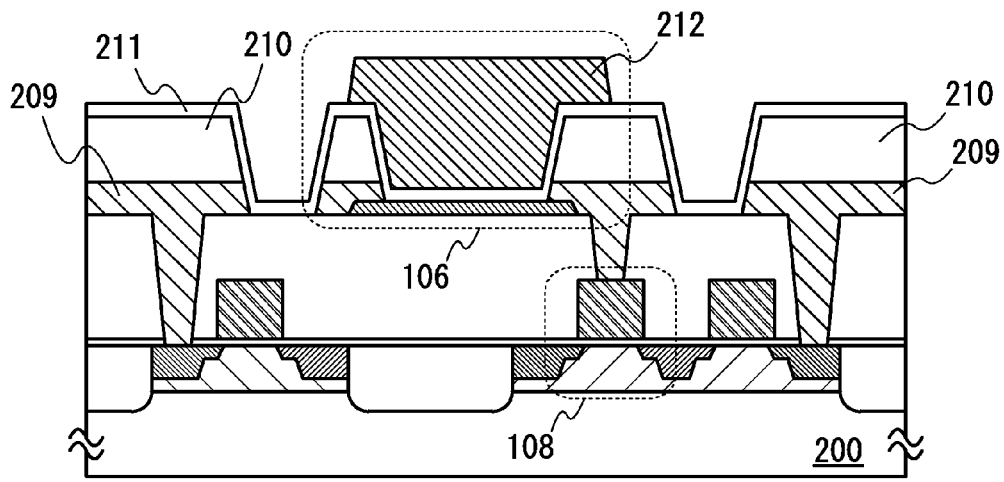

A second gate insulating film 211 is formed to cover the wiring 209 and the second interlayer insulator 210. Furthermore, a conductive material is deposited and the surface of the conductive material is planarized. The conductive material is a single layer or a multilayer and is preferably capable of blocking the transfer of hydrogen or water from an upper layer to a lower layer. The thickness of the conductive material is preferably larger than the distance between the top surface of the first interlayer insulator 206 and the top surface of the second interlayer insulator 210. The conductive material having the planarized surface is selectively etched to form a second gate wiring 212 (FIG. 6D).

The existence of the second interlayer insulator 210 can reduce parasitic capacitance between the wiring 209 and the second gate wiring 212. In the above-described manner, the measurement transistor 106 and the load transistor 108 can be formed.

Example

A ring oscillator corresponding to FIG. 3A is configured using a programmable logic array, and the current between a source and a drain in a subthreshold region of a transistor including an oxide semiconductor was measured using variation in frequency of the ring oscillator.

Figure 7:
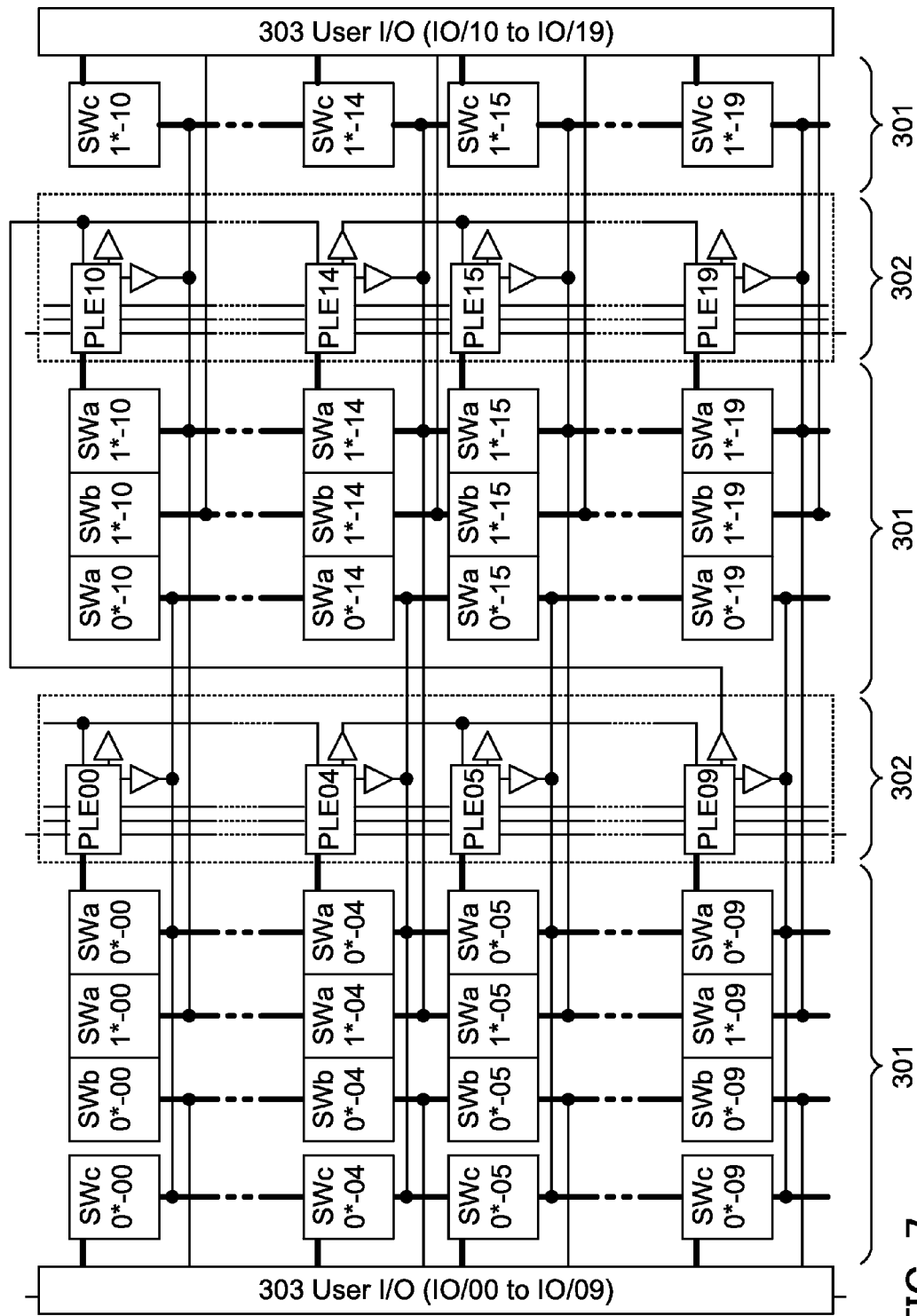
FIG. 7 illustrates an example of a configuration of a signal processing device.

FIG. 7 is a block diagram illustrating examples of structures of a switch array 301 and a memory logic array 302 of a programmable logic array, and an IO array 303.

In the memory logic array 302, a plurality of programmable logic elements PLE are arranged in an array. In the example illustrated in FIG. 7, in one memory logic array 302, ten programmable logic elements (PLE00 to PLE09 or PLE10 to PLE19) are arranged in a line. The programmable logic element includes a memory storing configuration data.

The IO arrays 303 are provided at both ends of the programmable logic array. In each of the IO arrays 303, ten input/output circuits (IO/00 to IO/09 or IO/10 to IO/19) are arranged in a line.

The switch array 301 is a circuit block including a plurality of switch circuits (SWa, SWb, and SWc) arranged in an array. Note that each of the switch circuits is programmable.

In FIG. 7, the switch circuit SWa controls conduction between the programmable logic elements PLE. Note that for example, "SWa0*-00" represents a switch circuit by which an output of any of PLE01 to PLE09 and an input of PLE00 can be connected and disconnected.

The switch circuit SWb controls conduction between an input terminal of the programmable logic element PLE and the input/output circuit of the IO array 303. Note that for example, "SWb0*-00" represents a switch circuit by which any of IO/01 to IO/09 and an input of PLE00 can be connected and disconnected.

The switch circuit SWc controls conduction between an output terminal of the programmable logic element PLE and the input/output circuit of the IO array 303. Note that for example, "SWc0*-00" represents a switch circuit by which any of IO/01 to IO/09 and an output of PLE00 can be connected and disconnected.

In addition, in one memory logic array 302, a carry chain is constituted of look-up tables (LUTs) in five programmable logic elements, and a register chain is constituted of registers (flip-flops) in ten programmable logic elements.

Figure 8:
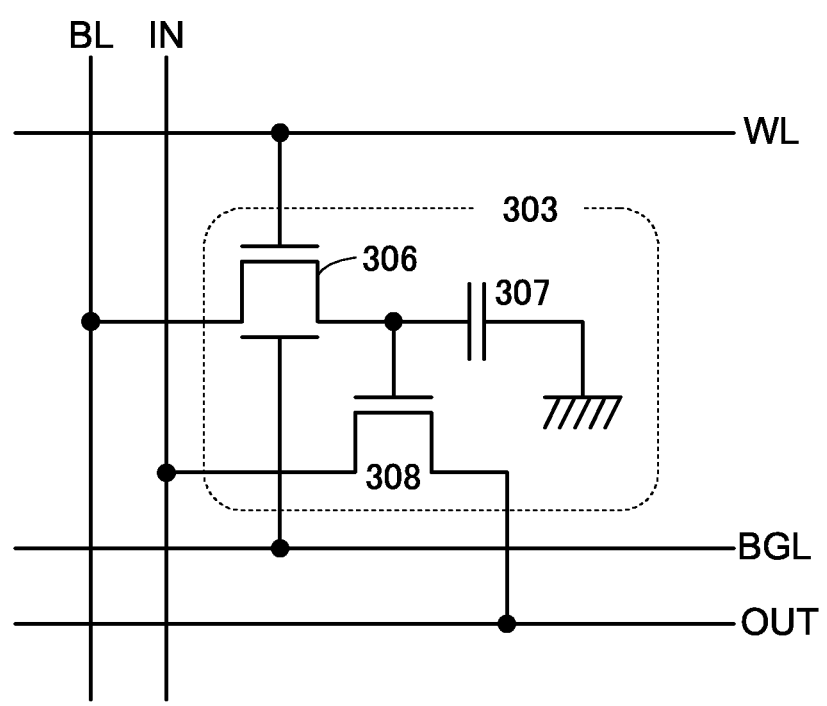
FIG. 8 illustrates an example of a circuit of a signal processing device.

As illustrated in FIG. 8, each switch circuit in the programmable logic array includes a writing transistor 306, a capacitor 307, and a pass transistor 308. The connection relations between the components are similar to those of the circuit illustrated in FIG. 4A. In other words, the measurement transistor 106, the capacitor 107, and the load transistor 108 in FIG. 4A correspond to the writing transistor 306, the capacitor 307, and the pass transistor 308 in FIG. 8, respectively. The pass transistor 308 controls conduction between two wirings IN and OUT.

In the writing transistor 306, the channel length was 1.0 μm, the channel width was 4 μm, and the thickness of a gate insulating film was 20 nm. In the pass transistor, the channel length was 0.5 μm, the channel width was 1 μm, and the thickness of a gate insulating film was 10 nm. The pass transistor 308 was formed through a CMOS process. The writing transistor 306 was a thin film transistor in which a channel is formed using an oxide semiconductor and was formed over a CMOS circuit including the pass transistor 308.

The capacitance of the capacitor 307 including parasitic capacitance was 184 fF. The gate capacitance of the pass transistor 308 was 15 fF.

For example, the switch circuit connects the programmable logic elements. Thus, one programmable logic element is configured to function as an inverter, and the programmable logic element and a switch circuit connected thereto are combined, so that a circuit corresponding to the signal transmission circuit illustrated in FIG. 2A is formed.

In this example, seven of the programmable logic elements were configured to function as inverters and the seven programmable logic elements were connected to each other by switch circuits, whereby a seven-stage ring oscillator was formed. One pass transistor 308 was provided between two inverters (i.e., the programmable logic elements set to function as the inverters) in this example. However, even if two or more pass transistors 308 are provided between the two inverters, a problem in measurement is not caused.

Note that a bit line BL, a word line WL, and a back gate line BGL in FIG. 8 correspond to the wiring 103, the wiring 104, and the wiring 105 in FIG. 3A, respectively. The potentials of a wiring IN and a wiring OUT were set to 0 V and the potential ($V_1$) of the gate of the pass transistor 308 was set to 2.5 V, and then the potential of the word line WL was set to 0 V. In addition, the potential of the bit line BL was also set to 0 V. Note that the potential of the back gate line BGL was set to −7 V to 0 V.

Figure 9A:
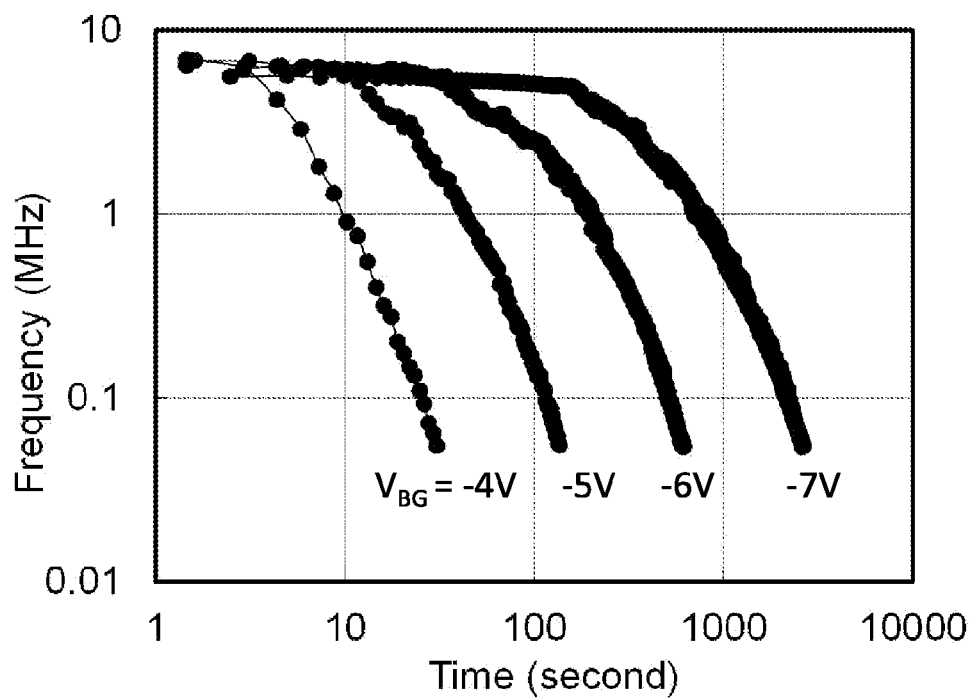
FIGS. 9A and 9B show measurement results of a signal processing device.

Then, the ring oscillator was oscillated and a change in frequency with time was measured. Results are shown in FIG. 9A. The time taken for the oscillation frequency to decrease increases as the potential of the back gate line BGL decreases. This is because a decrease in the potential of the gate of the pass transistor 308 is significantly small. Thus, the off-state resistance of the writing transistor 306 is high. Here, the off-state currents of the writing transistor 306 at different potentials of the back gate were estimated using time ($\tau_{f=1 MHz}(0, V_{BG})$) taken for the oscillation frequency to decrease to 1 MHz from the start of oscillation.

According to the current values measured by a semiconductor parameter analyzer (HP4155A) at $V_{BG}$ of 0 V, constant $C \cdot (V_1 - V_G)$ in the formula 8 was found to be 22.5 fC. In addition, it was found that the threshold voltage of the writing transistor 306 increased by 0.0457 V when the potential of the back gate decreased by 1 V. In other words, this is equivalent to a decrease in the potential of the gate of the writing transistor 306 (the potential of the word line WL) by 0.0457 V with a decrease in the potential of the back gate decreases by 1 V.

Figure 9B:
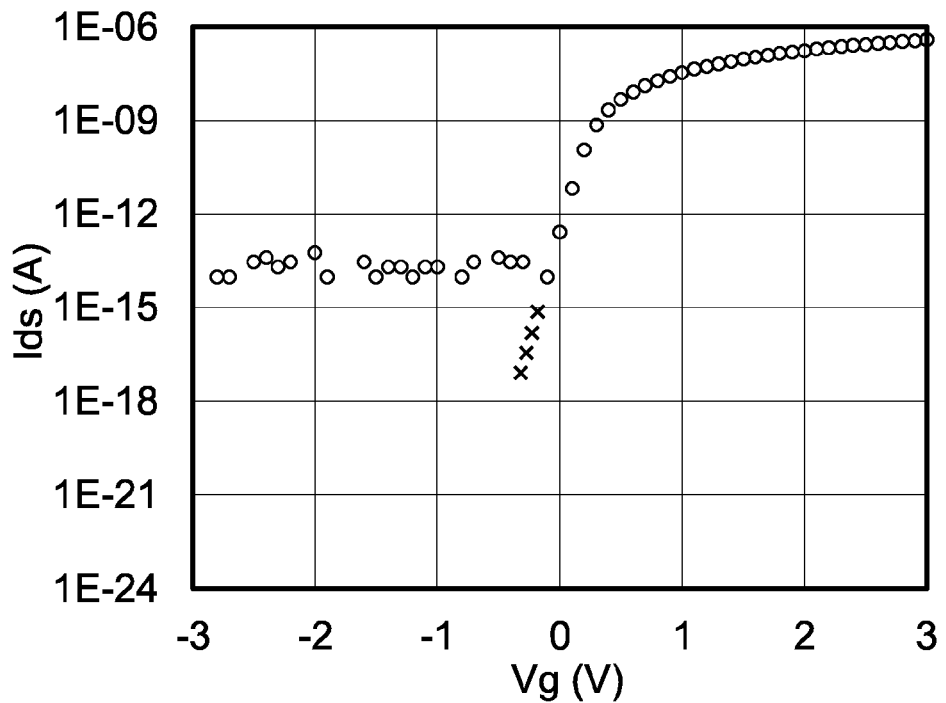

FIG. 9B shows results of the measurement by the semiconductor parameter analyzer, which are represented by o, and results obtained from measurement using the seven-stage ring oscillator, which are represented by x. The results demonstrate that current values of 1 fA or less can be measured using the ring oscillator, while small current values of 10 fA or less cannot be measured by the semiconductor parameter analyzer.

This application is based on Japanese Patent Application serial no. 2013-105633 filed with the Japan Patent Office on May 17, 2013, the entire contents of which are hereby incorporated by reference.

What is claimed is:

1. A signal processing device comprising:
(2n+1) signal transmission circuits (n is an integer greater than or equal to 1),
wherein one of the signal transmission circuits comprises:
an inverter;
a first transistor; and
a second transistor,
wherein one of an input terminal and an output terminal of the inverter is electrically connected to one of a source and a drain of the first transistor,
wherein one of a source and a drain of the second transistor is electrically connected to a gate of the first transistor,
wherein the other of the input terminal and the output terminal of the inverter is one of an input and an output of the one of the signal transmission circuits, and
wherein the other of the source and the drain of the first transistor is the other of the input and the output of the one of the signal transmission circuits, and
wherein an output of a k-th signal transmission circuit (k is an integer greater than or equal to 1 and less than or equal to 2n) is electrically connected to an input of a (k+1)-th signal transmission circuit, and
wherein an output of a (2n+1)-th signal transmission circuit is electrically connected to an input of a first signal transmission circuit.

2. The signal processing device according to claim 1, wherein the second transistor comprises an oxide semiconductor.

3. The signal processing device according to claim 1, wherein the second transistor comprises a back gate.

4. The signal processing device according to claim 1, further comprising a capacitor, wherein one of two electrode of the capacitor is electrically connected to the gate of the first transistor.

5. The signal processing device according to claim 1, further comprising:
a first capacitor;
a second capacitor; and
a switch,
wherein one of the first capacitor and the second capacitor is electrically connected to the gate of the first transistor by the switch.

6. The signal processing device according to claim 1, further comprising a first wiring,
wherein the first wiring is electrically connected to each of the (2n+1) signal transmission circuits, and
wherein the first wiring is electrically connected to the other of the source and the drain of the second transistor.

7. The signal processing device according to claim 1, further comprising a second wiring,
wherein the second wiring is electrically connected to each of the (2n+1) signal transmission circuits, and
wherein the second wiring is electrically connected to the gate of the second transistor.

8. A measuring method of a signal processing device,
wherein the signal processing device comprises (2n+1) signal transmission circuits (n is an integer greater than or equal to 1),
wherein one of the signal transmission circuits comprises:
an inverter;
a first transistor; and
a second transistor,
wherein one of an input terminal and an output terminal of the inverter is electrically connected to one of a source and a drain of the first transistor,
wherein one of a source and a drain of the second transistor is electrically connected to a gate of the first transistor, wherein the other of the input terminal and the output terminal of the inverter is one of an input and an output of the one of the signal transmission circuits, and wherein the other of the source and the drain of the first transistor is the other of the input and the output of the one of the signal transmission circuits, wherein an output of a k-th signal transmission circuit (k is an integer greater than or equal to 1 and less than or equal to 2n) is electrically connected to an input of a (k+1)-th signal transmission circuit, and wherein an output of a (2n+1)-th signal transmission circuit is electrically connected to an input of a first signal transmission circuit, the measuring method comprises:

setting a potential of a gate of the first transistor to a first potential higher than threshold voltage of the first transistor; and measuring a frequency of an output of any one of the first to the (2n+1)-th signal transmission circuits and measuring time taken for the frequency to reach a predetermined value.

9. The measuring method according to claim 8, further comprising: obtaining an off-state current of the second transistor on the basis of the time.

10. The measuring method according to claim 8, further comprising:

setting a second potential of a gate of the second transistor and a third potential of the other of the source and the drain of the second transistor so that the second transistor is in a subthreshold state after setting the potential of the gate of the first transistor to the first potential.

11. The measuring method according to claim 8, further comprising:

measuring a second frequency of an output of the any one of the first to the (2n+1)-th signal transmission circuits and measuring second time taken for the second frequency to reach the predetermined value, and measuring a current flowing between the source and the drain of the second transistor in an on state for obtaining the off-state current.

12. A method of measuring an off-state current of a transistor, comprising:

obtaining a first physical quantity relating to an off-state current by a first method by applying a potential in a first range to a gate of the transistor; and obtaining a second physical quantity relating to an off-state current by a second method by applying a potential in a second range to the gate of the transistor, wherein the first range includes a region overlapping with the second range, and wherein a coefficient for converting the second physical quantity into the first physical quantity obtained in the region where the first range overlaps the second range is obtained.

13. The measuring method according to claim 12, wherein the first physical quantity is time taken for an oscillation frequency of a ring oscillator comprising the transistor to decrease to a predetermined frequency.

14. The measuring method according to claim 12, wherein the second physical quantity is time taken for an oscillation frequency of a ring oscillator comprising the transistor to decrease to a predetermined frequency.

* * * * *